United States Patent [19]
Cohen

[11] Patent Number: 5,977,889
[45] Date of Patent: Nov. 2, 1999

[54] OPTIMIZATION OF DATA REPRESENTATIONS FOR TRANSMISSION OF STORAGE USING DIFFERENCES FROM REFERENCE DATA

[75] Inventor: Norman Howard Cohen, Spring Valley, N.Y.

[73] Assignee: International Business Machines Corporation, Armonk, N.Y.

[21] Appl. No.: 08/869,560

[22] Filed: Jun. 5, 1997

[51] Int. Cl.⁶ ........................................... H03M 7/44
[52] U.S. Cl. ................................. 341/55; 341/87
[58] Field of Search ........................... 341/510, 51, 55, 341/87; 707/101

[56] References Cited

U.S. PATENT DOCUMENTS

| | | | |
|---|---|---|---|
| 4,074,254 | 2/1978 | Belser et al. ............................. | 365/231 |
| 5,363,098 | 11/1994 | Antoshenkov ............................. | 341/95 |
| 5,710,919 | 1/1998 | Rail ......................................... | 707/101 |
| 5,907,297 | 5/1999 | Cohen et al. ............................. | 341/95 |

OTHER PUBLICATIONS

McFadden et al. Data Base Management, pp. 303–309 1985.

*Primary Examiner*—Jack M. Choules
*Attorney, Agent, or Firm*—Douglas W. Cameron; Ronald L. Drumheller

[57] ABSTRACT

A method of compressing data, including representations of objects, for future transmission or storage. More specifically, this invention compresses a representation of differences between a base sequence of data and the actual data to be transmitted or stored. Sparse bit masks representing the positions of insertions and deletions from a base sequence are iteratively compressed by representing consecutive sequences of zero-valued bits with single zero-valued bits.

8 Claims, 5 Drawing Sheets

OPTIMIZATION OF DATA REPRESENTATIONS FOR TRANSMISSION OF STORAGE USING DIFFERENCES FROM REFERENCE DATA

DESCRIPTION

1. Technical Field

This invention relates to a method and apparatus for compressing data to reduce storage and bandwidth requirements.

2. Description of the Prior Art

Compression of data has long been used for two distinct purposes, to reduce the amount of storage space required to hold data on a storage medium and to reduce the number of bits that must be sent over a communications link to transmit the data. One well-known method for compression is to represent the data to be compressed in terms of its differences from some base set of data. For example, [16] applies differencing in a file backup subsystem so that changed versions of a file can be stored in terms of their differences from the original file. Another method [25] is to exploit multiple occurrences of a given pattern within the data to be compressed, replacing each occurrence of such a pattern with a shorter sequence of data acting as a placeholder for the pattern. A special case of this approach is run-length encoding, which entails abbreviating repeated consecutive occurrences of a given bit pattern by a single occurrence of that pattern plus a count of the number of times the pattern is repeated. Various clever schemes, such as that of [20], can be used to reduce the amount of storage occupied by the count. [4] rearranges data to be compressed in a manner that increases the likelihood that adjacent bits will have the same value, thus increasing the average number of times a pattern is repeated and increasing the effectiveness of run-length encoding.

The effectiveness of a compression technique, measured by the factor by which compression reduces the length of the data, depends on the nature of the data to be compressed. Some existing methods are effective when applied to files that are likely to be modified on a line-by-line basis, others are effective when applied to monochromatic fax images, and still others are effective when applied to video images, for example. A method designed for one kind data is not, in general, as effective when applied to other kinds of data. Existing techniques are not designed to be effective for compressing modifications to objects in a distributed object-oriented system. Such an object is typically transmitted in a byte stream containing a serialized representation of the object. Within such a byte stream, changes to a given object are likely to take the form of a few scattered byte sequences, constituting a very small portion of the length of the byte stream, replacing other byte sequences, possibly of a different length.

SUMMARY OF THE INVENTION

An edit sequence is a description of the differences between two sequences of data. Given one of these sequences of data and the edit sequence, it is possible to reconstruct the other sequence of data. The invention represents edit sequences in a compressed form.

The invention represents an edit sequence for two byte sequences in terms of three components: (1) a sequence of bytes inserted by the edit sequence, in order; (2) a bit sequence containing one bit for each byte in the first byte sequence, indicating whether the corresponding byte is deleted by the edit sequence; (3) a bit sequence containing one bit for each byte in the second byte sequence, indicating whether the corresponding byte is inserted by the edit sequence.

Given two similar byte strings, a packed representation of these three components will contain many zero bytes (i.e., bytes all of whose bits are 0). The invention repeatedly applies the following repacking transformation to the representation until the transformation fails to yield a shorter representation: Given a byte string S, a bit sequence is constructed with one bit for each byte of S, having the value 0 if the corresponding byte is zero and having the value 1 otherwise. This sequence of bits is packed and appended to a byte sequence containing all the nonzero bytes of S. The result replaces S.

Both the original three-component representation of the edit sequence and the result of the repacking transformation include an encoding of the number of times repacking has been applied, so that the process can be reversed. Both the original three-component representation of the edit sequence and the result of the repacking transformation include counts giving the lengths of the sequences they contain. These counts are encoded in a manner that tends to concentrate the nonzero bytes near the beginning of the string, thus increasing the likelihood that repacking will result in a shorter string.

This invention is equally applicable when bytes are replaced by other units such as words or half words.

DESCRIPTION OF THE PREFERRED EMBODIMENT

Figure 1:
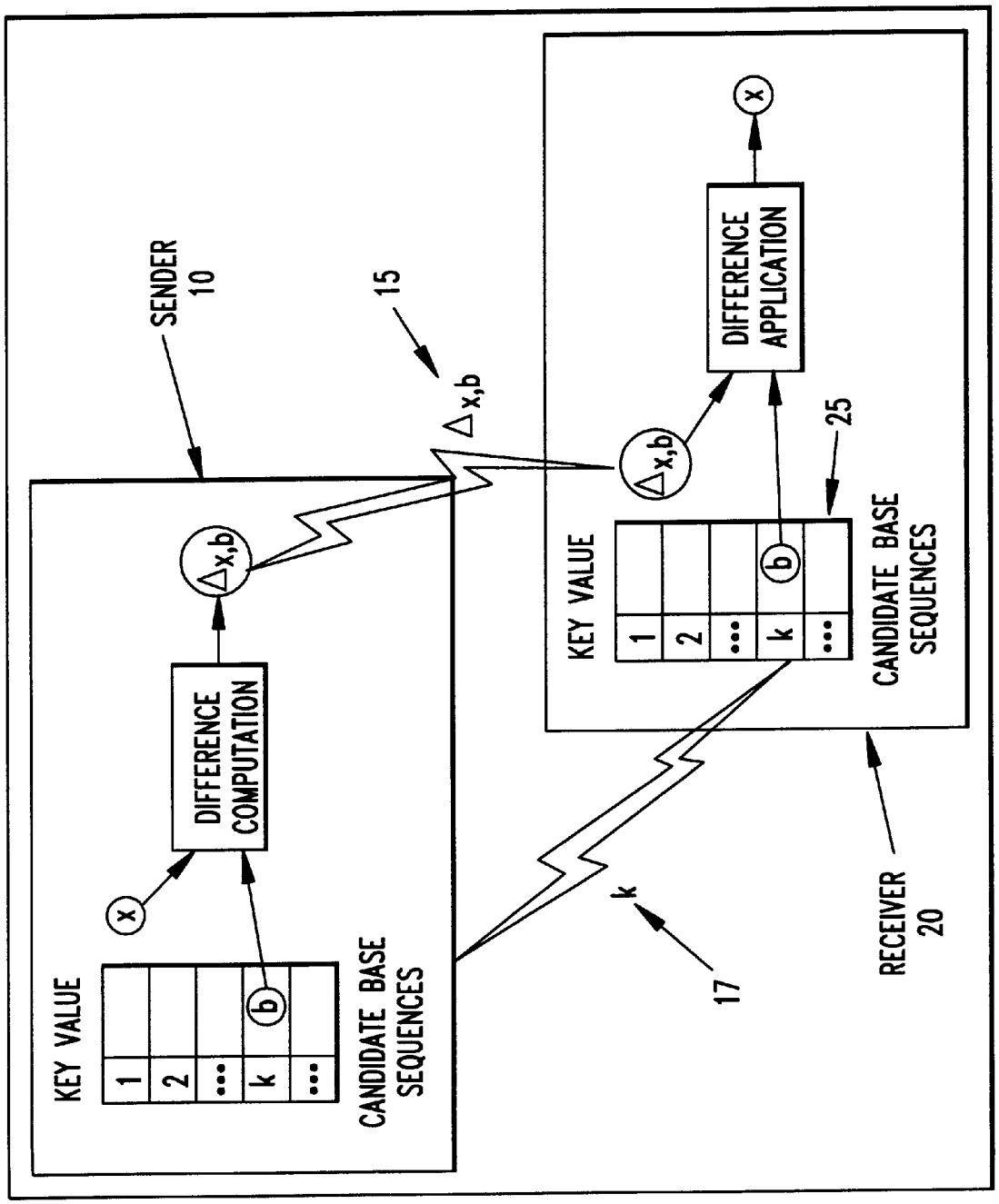
FIG. 1 schematically illustrates the overall environment in which the invention is implemented.

A sequence of values is data, such as a string of bytes in a computer memory, that may represent some computational entity such as a Java object. Referring to FIG. 1, this invention constructs a succinct representation, $\Delta_{x,b}$, for the differences between a sequence of values x and a base sequence of values b. These differences can be applied to b to restore x.

A collection of data with many elements similar to b can be compressed by replacing x with $\Delta_{x,b}$.

Given a low-bandwidth or high-cost communications link with a copy of b present at each side of the link, the effect of transmitting x across the link can be achieved by computing $\Delta_{x,b}$ on the transmitting side 10 of the link, transmitting $\Delta_{x,b}$ 15 across the link, and reconstructing x from $\Delta_{x,b}$ and b on the receiving side 20 of the link.

In a typical application, there will be many candidate sequences of values present on both sides of the link that can serve as the base sequence b. Then, along with $\Delta_{x,b}$, we must transmit a short key 17 (such as an array subscript) indicating which candidate is to be used as the base.

For example, in a distributed database system, the collections of candidate base sequences 25 could consist of items already in the database and known to be cached by the receiver. The invention produces more succinct representations of $\Delta_{x,b}$ when there are fewer differences between x and b. Thus a system incorporating the invention should choose a base sequence close to x. For example, if an item x in a distributed database system results from making small changes to some other item b already in the database and known to be present at the other nodes of the distributed system, it makes sense to use b as the base for transmitting x to the other nodes.

In an object-oriented distributed system, x could be a serialized representation of an object to be transmitted, e.g., in a remote procedure call, to another node. The collection of candidate base sequences 25 could be a set of serialized representations of base objects, such that x is likely to be a small mutation of one of the base objects. (Instead of storing such serialized representations in a large table, such a system could maintain mirrored caches of objects at the sending and receiving nodes, use the key 17 to retrieve objects, and compute serialized representations from retrieved objects on demand.)

Algorithm for Constructing $\Delta_{x,b}$

Figure 2:
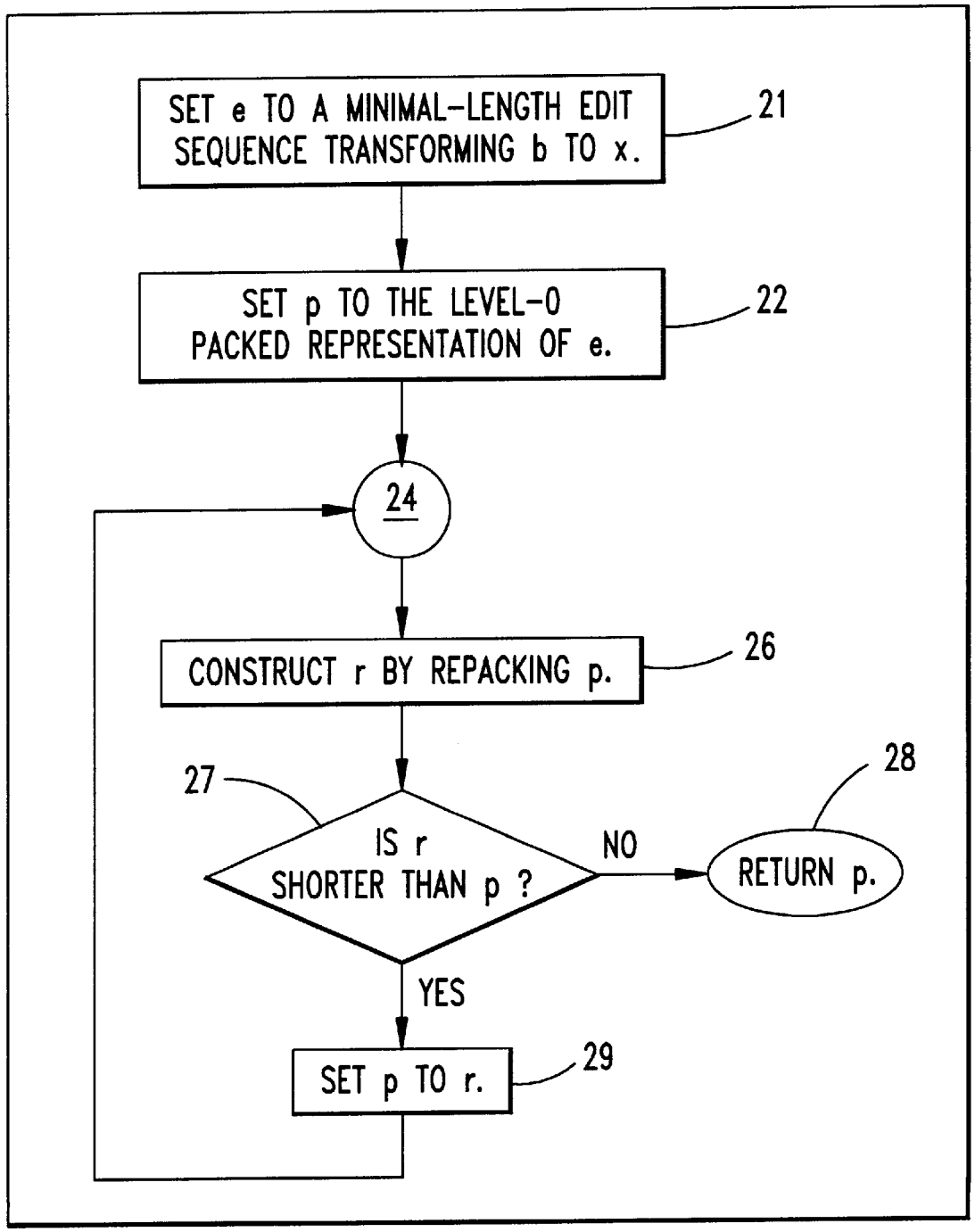
FIG. 2 is a flowchart schematically illustrating the compression of data in accordance with the invention.

Shown in FIG. 2 is a flowchart summarizing the algorithm used for generating $\Delta_{x,b}$ from x and b. The terms minimal-length edit sequence, level-0 packed representation, and repack used in the flowchart are explained below.

Minimal-Length Edit Sequences and Longest Common Subsequences

Given two sequences of values b and x, a minimal-length edit sequence transforming b into x is the shortest possible sequence of deletions of values from specified positions and insertions of specified values at specified positions that, when applied to b, will yield x. For example, if we view the strings "REDMOND" and "ARMONK" as sequences of character values, a minimal-length edit sequence transforming the first string into the second consists of five operations: deleting the characters 'E', 'D', and 'D', inserting the 'A' before the 'R', and inserting the 'K' after the 'N'.

The problem of computing the minimal-length edit sequence between two sequences of values is equivalent to the problem of finding a longest common subsequence (LCS) shared by those sequences of values. A subsequence of a sequence of values s is another sequence of values, all of whose elements occur, perhaps with other values interleaved, in the same order in s. A longest common subsequence of two sequences x and y is a a maximal-length sequence of values that is a subsequence of both x and y. For example, subsequences of "ARMONK" include "A", "AMN", "ROK", and "AK", among others; subsequences of "REDMOND" include "R", "RDOD", and "EDD", among others. The longest sequence of character values that is common to "ARMONK" and "REDMOND" is "RMON". Given a common subsequence between sequences x and y, one can construct an edit sequence transforming x into y by deleting values in x that are not part of the common subsequence and inserting, at the appropriate places, values in y that are not part of the common subsequence.

Every edit sequence transforming x into y can be characterized in this way. The more values there are in the common subsequence, the fewer insertions and deletions there are in the resulting edit sequence. Thus a longest common subsequence corresponds to a minimal-length edit sequence.

There are many algorithms known for computing minimal-length edit sequences (or, equivalently, longest common subsequences). Such algorithms are presented in [1], [2], [3], [5], [6], [7], [8], [9], [10], [11], [13], [15], [17], [18], [19], [21], [22], [23], and [24]. Our embodiment uses (see 21 of FIG. 2) the Miller-Myers algorithm [15] (independently discovered by Ukkonen [22]) because of its simplicity and relative efficiency. Reference [15] is hereby incorporated herein by reference. This is also the algorithm used in the GNU diff program [12] and in the electrocardiogram data compression system described in [14]. Different algorithms to compute minimal edit sequences differ in the amount of time and space needed to perform the computation, but not, of course, in the length of the resulting edit sequence (which is, by definition, minimal).

The Level-0 Packed Representation of an Edit Sequence

An edit sequence can be characterized by three pieces of data:

the set of positions in the original sequence from which values are deleted the set of positions in the resulting sequence at which values are inserted an ordered list of the values that have been inserted at the latter positions This data is sufficient to apply the edit sequence to the original sequence of values. (In particular, the actual values deleted from the original sequence are not needed.)

The level-0 packed representation of the edit sequence is a representation of these three pieces of data. See 22 of FIG. 2. In our embodiment, our sequences of values are sequences of 8-bit bytes and, referring to FIG. 3, the level-0 packed representation 100 is a sequence of 8-bit bytes consisting of the following:

A descriptor byte 102 whose six high order bits are a level number 102A and whose two low-order bits 102B indicate the number of bytes needed to hold the number of insertions. (That is, the two low-order bits indicate the length of the insertion count itself) The level number for a level-0 packed representation is always zero. If the number of insertions is less than $2^8$, the insertion count 104 is one byte long, and the corresponding bits 102B of the descriptor byte have the values 00. Otherwise, if the number of insertions is less than $2^{16}$, the insertion count 104 is two bytes long, and the corresponding bits 102B of the descriptor byte have the values 01. Otherwise, if the number of insertions is less than $2^{24}$, the insertion count 104 is three bytes long, and the corresponding bits 102B of the descriptor byte have the values 10. Otherwise, if the number of insertions is less than $2^{32}$, the insertion count 104 is four bytes long, and the corresponding bits 102B of the descriptor byte have the values 11. The embodiment can only encode edit sequences with fewer than $2^{32}$ insertions; however, it would be straightforward to allow for a number of insertions exceeding $2^{32}$.

The insertion count 104, i.e., the number of bytes of insertions: The length of the insertion count is as indicated by lower order two bits 102B of the descriptor byte. Lower-order bytes of the insertion count occur earlier (i.e., the insertion count is given in "little-endian" form).

The sequence of byte values 106 inserted by the edit sequence: The number of bytes in this sequence is given by the insertion count 104. Bytes in this sequence occur in the same order as in the byte sequence that results from applying the edit sequence.

The interleaved lengths 108 of the insertion mask and the deletion mask (each described below): The insertion-mask length 111 and the deletion-mask length 113 are 4-byte integers, each indicating the number of bits in the corresponding mask. If we designate the four bytes of the insertion-mask length 111, going from least significant to most significant, as I0, I1, I2, and I3, and the four bytes of the deletion-mask length 113, going from least significant to most significant, as D0, D1, D2, and D3, then their interleaved lengths consist of the bytes I0, D0, I1, D1, I2, D2, I3, D3, in that order. See 108 of FIG. 3.

The insertion mask 110: The insertion mask contains one bit for each byte of the byte sequence that results from applying the edit sequence. A 0 bit indicates that the corresponding byte of the edit-sequence result was part of the original byte sequence; a 1 bit indicates that the corresponding byte of the edit-sequence result was inserted by the edit sequence. An insertion mask with b bits is represented in ceiling(b/8) bytes (i.e., the smallest whole number of bytes greater than or equal to b/8), with earlier bytes of the representation, and higher-order bits within a given byte, holding earlier bits of the insertion mask. The last byte of the insertion mask may contain up to 7 padding bits following the last bit of the mask.

The deletion mask 112. The deletion mask contains one bit for each byte of the original byte sequence to which the edit sequence is applied. A 1 bit indicates that the corresponding byte of the original byte sequence is deleted by the edit sequence; a 0 bit indicates that it is not deleted. A deletion mask with b bits is represented in ceiling(b/8) bytes, with earlier bytes of the representation, and higher-order bits within a given byte, holding earlier bits of the deletion mask. The last byte of the deletion mask may contain up to 7 padding bits following the last bit of the mask.

Figure 4:
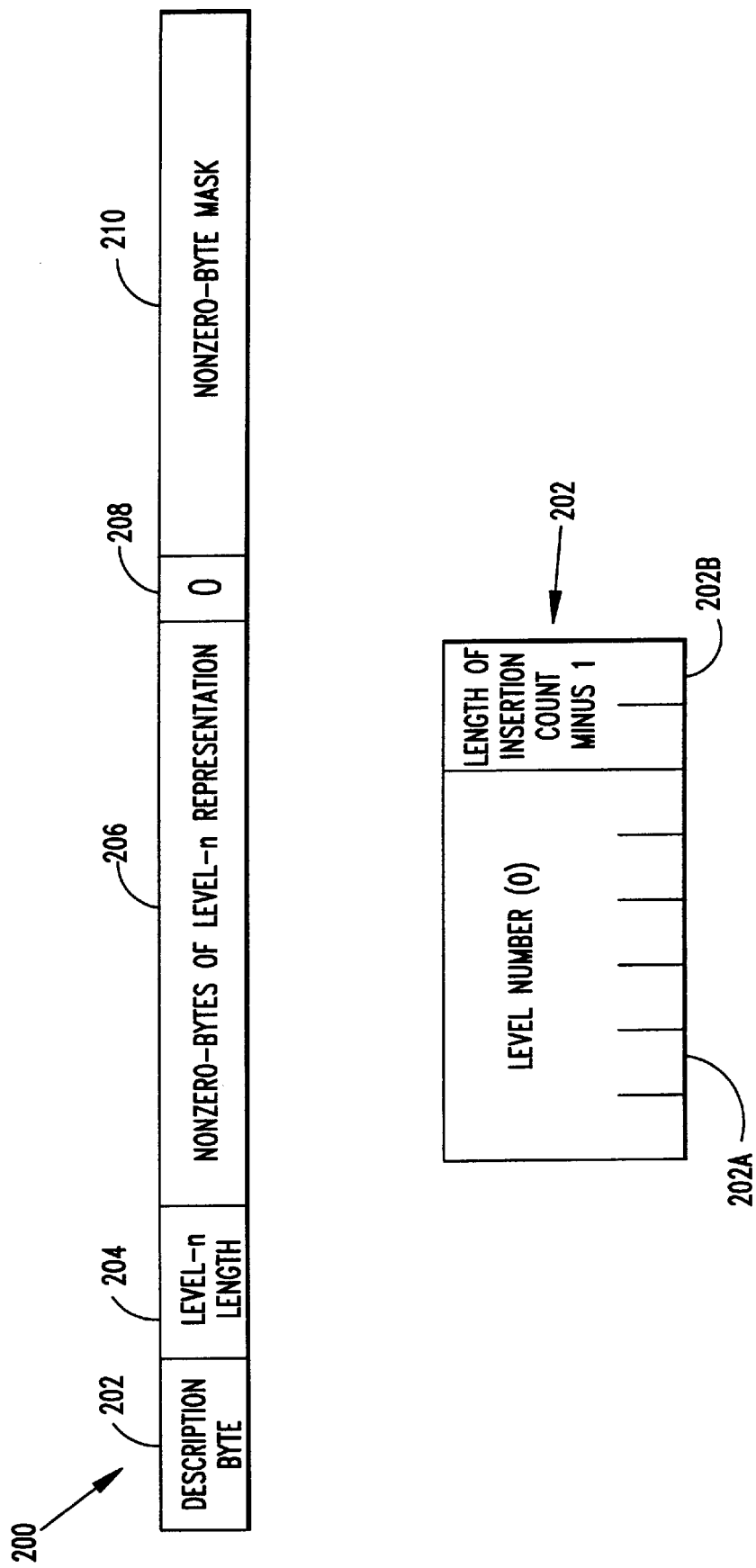
FIG. 4 schematically illustrates a level-(n+1) packed representation of an edit sequence.

Referring to FIG. 2, repacking 26 is the process of converting a level-n packed representation into a level-(n+1) packed representation (See 200 of FIG. 4.), where n is some value from 0 to a specified maximum (63 in our embodiment), inclusive. The level-(n+1) packed representation is a compressed form of the level-n packed representation. In our embodiment, the level-(n+1) packed representation is a sequence of 8-bit bytes consisting of the following:

Referring to FIG. 4, a descriptor byte 202 whose six high order bits 202A are a level number and whose two low-order bits 202B indicate the number of bytes needed to hold the level-n length 204, which length is the number of bytes in the level-n packed representation. The level number for a level-(n+1) packed representation is n+1. If the number of bytes in the level-n packed representation is less than $2^8$, the level-n byte count 204 is one byte long, and the corresponding bits 202B of the descriptor byte 202 have the values 00. Otherwise, if the number of bytes in the level-n packed representation is less than $2^{16}$, the level-n byte count 204 is two bytes long, and the corresponding bits 202B of the descriptor byte have the values 01. Otherwise, if the number of bytes in the level-n packed representation is less than $2^{24}$, the level-n byte count 204 is three bytes long, and the corresponding bits 202B of the descriptor byte have the values 10. Otherwise, the level-n byte count 204 is four bytes long, and the corresponding bits 202B of the descriptor byte have the values 11.

The level-n byte count 204, i.e., the number of bytes in the level-n packed representation. The length of the level-n byte count is as indicated by the two low-order bits 202B of the descriptor byte. Lower-order bytes of the count occur earlier (i.e., the count is given in "little-endian" form).

The nonzero bytes 206 of the level-n packed representation, occurring in the same order as in the level-n packed representation.

A zero byte, 208, marking the end of the nonzero bytes.

A mask 210 containing one bit for each byte of the level-n packed representation, with a 0 bit indicating that the corresponding byte of the level-n packed representation has the value 0 and a 1 bit indicating that the corresponding byte of the level-n packed representation has one of the values 1 through 255. A mask with m bits is represented in ceiling (m/8) bytes (i.e., the smallest whole number of bytes greater than or equal to m/8), with earlier bytes of the representation, and higher-order bits within a given byte, holding earlier bits of the mask. The last byte of the mask may contain up to 7 padding bits following the last bit of the mask.

Algorithm for Reconstructing x from $\Delta_{x,b}$ and b

Figure 5:
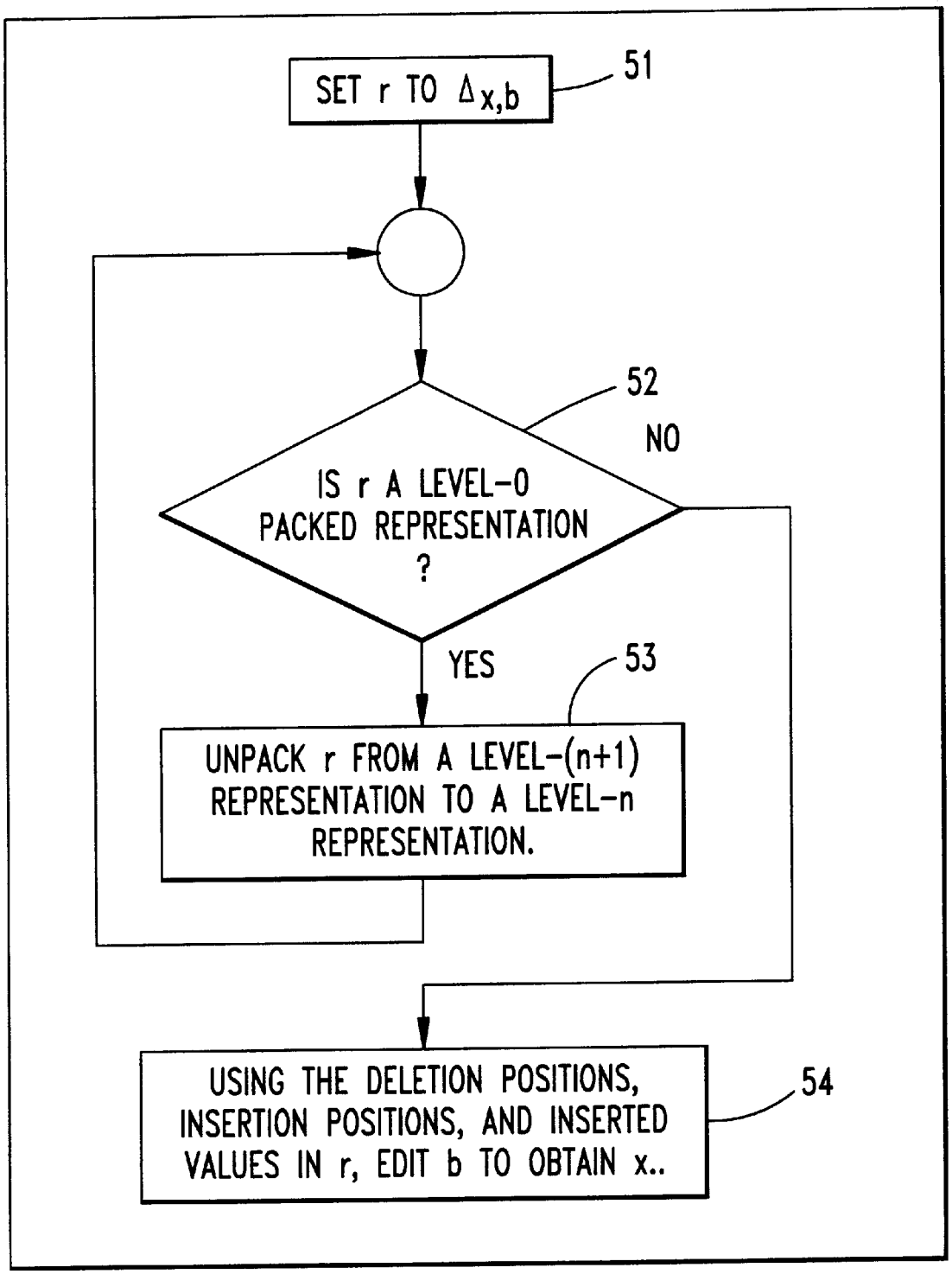
FIG. 5 is a flowchart schematically illustrating the recovery of an original sequence from its compressed representation.

Referring to FIG. 5, let variable r represent a level-n packed packet representation of $\Delta_{x,b}$ for some integer n≧0. See 51.

The level of a packed representation r can be determined 52 by examining the high-order 6 bits of the descriptor byte, which is the first byte of r.

A level-(n+1) packed representation can be unpacked 53 into a level-n packed representation as follows, referring to FIG. 4:

1. Examine the two low-order bits 202B of the descriptor byte 202 to determine the length, L, of the level-n byte count 204.

2. Extract the level-n byte count, c, from the next L bytes 204 of r and create an array of c bytes.

3. Establish an index into the sequence 206 of nonzero bytes from the level-n representation 200, which sequence starts after the last byte of the level-n byte count 204. Initially, the index refers to the beginning of the sequence.

4. Scan for the zero byte 208 at the end of the sequence of nonzero bytes 202 and establish an index into the mask 210, which starts after the zero byte 208.

5. Fill in each element of the byte array according to the corresponding bit of the mask 210. If the mask bit is 1, the value to be placed in the byte-array element is taken from the currently indexed position in the sequence of nonzero bytes 206, and the index is advanced. If the mask bit is 0, the value 0 is placed in the byte-array element.

Figure 3:
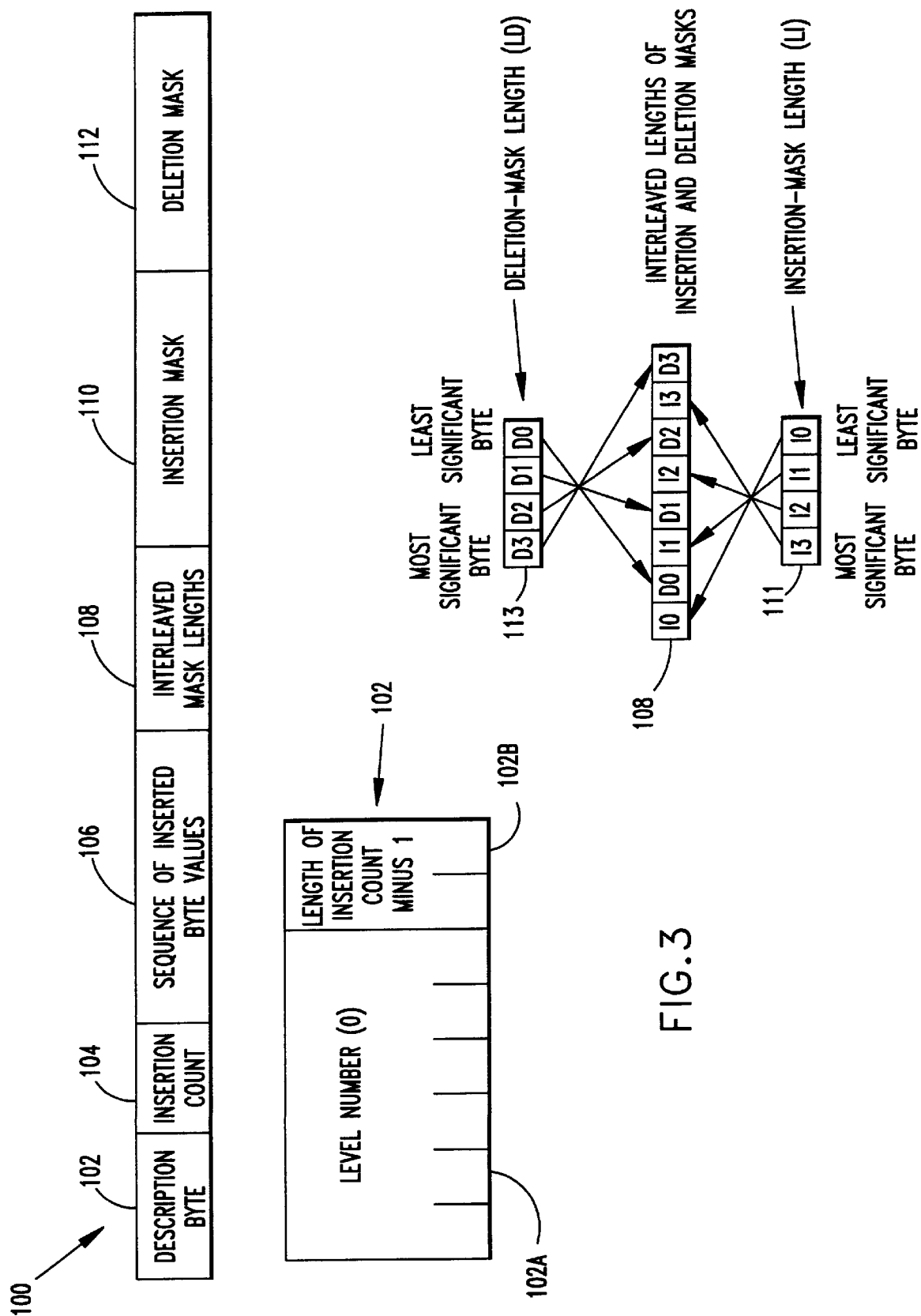
FIG. 3 schematically illustrates the level-zero packed representation of an edit sequence.

Referring to FIG. 3, a level-0 packed representation (100) r of $\Delta_{x,b}$ can be used to edit b, obtaining x (See 54 of FIG. 5), as follows:

1. Examine the two low-order bits 102B of the descriptor byte 102 to determine the length, L, of the insertion count.

2. Extract the insertion count, c, from the next L bytes 104 of r.

3. Establish an index i into the sequence 106 of inserted byte values, which starts after the last byte of the insertion count 104. Initially, the index refers to the beginning of the sequence.

4. Find the interleaved lengths 108 of the insertion and deletion masks starting c bytes after the first inserted byte value and reconstruct the insertion-mask length LI (111) and the deletion-mask length LD (113). (Note that LI is the required length for x and LD is the length of b.)

5. Establish an index j into the insertion mask 110, which begins c+8 bytes after the first inserted byte value.

6. Establish an index k that will identify elements of b as well as the corresponding elements of the deletion mask 112, which begins LI bytes after the beginning of the insertion mask.

7. Create an array of LD bytes that will hold x.

8. Fill in each element of x according to the corresponding bit of the insertion mask 110. If the insertion-mask bit is 1, the value to be placed in the element of x is taken from the position in the sequence 106 of inserted byte values currently indexed by i, and the index i is advanced. If the insertion-mask bit is 0, advance the index k as many times as necessary (possibly 0) until k indexes a zero bit in the deletion mask, then copy the byte of b currently indexed by k into x. In either case, advance the index j to index the next element of the insertion mask 110 and the next element of x.

References

1. Apostolico, A., Browne, S., and Guerra, C. Fast linear-space computations of longest common subsequences. *Theoretical Computer Science* 92, No. 3 (1992), 17.

2. Apostolico, A., and Guerra, C. The longest common subsequence problem revisited. *Algorithmica* 2 (1987), 315–336.

3. Chin, Francis Y. L., and Poon, C. K. A fast algorithm for computing longest common subsequences of small alphabet size. *Journal of Information Processing* 13, No. 4 (1990), 460–469.

4. Cole, Michael L. and Eulmi, Sam H., "Recursive Data Compression," U.S. Pat. No. 5,488,364, Jan. 30, 1996.

5. Eppstein, D., Galil, Z., Giancarlo, R., and Italiano, G. Sparse dynamic programming I: linear cost functions. *Journal of the ACM* 39, No. 6 (July 1992), 519–545.

6. Fraser, Campbell B. *Subsequences and Supersequences of Strings*. Ph.D. thesis, University of Glasgow, 1995.

7. Hsu, W. J., and Du, M. W. New algorithms for the LCS problem. *Journal of Computer and System Sciences* 29 (1984), 133–152.

8. Hirschberg, Daniel S. A linear space algorithm for computing maximal common subsequences. *Communications of the ACM* 18, No. 6 (June 1975), 341–343.

9. Hirschberg, Daniel S. Algorithms for the longest common subsequence problem. *Journal of the ACM* 24, No. 4 (October 1977), 664–675.

10. Hunt, J. W., and Szymanski, T. G. A fast algorithm for computing longest common subsequences. *Communications of the ACM* 20, No. 5 (May 1977), 350–353.

11. Kumar, S. Kiran, and Rangan, C. Pandu. A linear space algorithm for the LCS problem. *Acta Informatica* 24 (1987), 353–362.

12. MacKenzie, David, Eggert, Paul, and Stallman, Richard. Comparing and merging files. Free Software Foundation, 1993.

13. Masek, W. J., and Paterson, M. S. A faster algorithm for computing edit string distances. *Journal of Computer and System Science* 20, No. 1 (1980), 18–31.

14. Morita, Hiroyoshi, and Kobayashi, Kingo. Data compression of ECG based on the edit distance algorithms. *IEICE Transactions on Information and Systems* E76-D, No. 12 (December 1993), 1443–1453.

15. Miller, Webb, and Myers, Eugene W. A file comparison program. *Software—Practice and Experience* 15, No. 11 (November 1985), 1025–1040.

16. Morris, Robert J. T., "System and Method for Reducing Storage Requirement in Backup Subsystems Utilizing Segmented Compression and Differencing," U.S. Pat. No. 5,574,906, Nov. 12, 1996.

17. Myers, Eugene W. An O(ND) difference algorithm and its variations. *Algorithmica* 1, No. 2 (1986), 251–266.

18. Nakatsu, N., Kambayashi, Y., and Yajima, S. A longest common subsequence algorithm suitable for similar text strings. *Acta Informatica* 18 (1982), 171–179.

19. Rick, Claus. A new flexible algorithm for the longest common subsequence problem. *Nordic Journal of Computing* 2 (1995), 444–461.

20. Takahara, Toru, "Encoder in Facsimile Apparatus Generates Code Words with One Bit Address Indicating Remaining Bits Are Raw Unencoded Data When Number of Pixels in a Run Length Are Below a Predetermined number," U.S. Pat. No. 5,493,407, Feb. 20, 1996.

21. Tichy, W. The string-to-string correction problem with block moves. *ACM Transactions on Computing Systems* 2 (1984), 309–321.

22. Ukkonen, Esko. Algorithms for approximate string matching. *Information and Control* 64 (1985), 100–118.

23. Wagner, R. A., and Fischer, M. J. The string-to-string correction problem. *Journal of the ACM* 21, No. 1 (January 1974), 168–173.

24. Wu, S., Manber, U., Myers, G., and Miller, W. An O(np) sequence comparison algorithm. *Information Processing Letters* 35 (September 1990), 317–323.

25. Ziv, J., and Lempel, A. "Compression of Individual Sequences Via Variable Rate Encoding," *IEEE Transactions on Information Theory* IT-24, No. 5, 1978, pp. 530–536.

Having thus described our invention, what we claim as new and desire to secure by Letters Patent is:

1. A method of compressing a main sequence of data values for transmission or storage, using a base sequence of data values, said method comprising:

a. computing a minimal set of deletion positions from said base sequence of values and insertions into the resulting sequence of values, such that the result of performing said deletions and insertions is said main sequence;

b. constructing a deletion mask indicating said set of deletion positions in said base sequence;

c. constructing an insertion mask indicating the set of positions in said main sequence at which said insertions have occurred;

d. constructing an ordered list of the values to be inserted by said insertions; and e. combining said insertion mask, said deletion mask and said ordered list to represent the difference between said base sequence and said main sequence.

2. A method as recited in claim 1, wherein said insertion mask, said deletion mask and said ordered list are combined into a level-zero packed representation so as to increase the likelihood that occurrences of the value zero occur contiguously in said level-zero packed representation.

3. A method for compressing an input sequence of values, said method comprising:

setting a current sequence of values to said input sequence and repeating the following steps until a repetition of said steps no longer generates a shorter current sequence of values, wherein the shortest current sequence of values obtained by a repetition of steps (a) through (c) represents a compression of said input sequence of values:

a. constructing an ordered list of nonzero values of said current sequence;

b. constructing a mask indicating positions at which said nonzero values occur in said current sequence; and c. constructing a result sequence of values comprising said ordered list, said mask and a count of the number of times steps (a) through (c) have been applied, thus obtaining a new current sequence of values to be used as input to a subsequent repetition of steps (a) through (c).

4. A method of compressing data for transmission or storage, comprising:

setting a current sequence of values to said input sequence and repeating the following steps until a repetition of said steps no longer generates a shorter current sequence of values, wherein the shortest current sequence of values obtained by a repetition of steps (a) through (c) represents a compression of said input sequence of values:

a. constructing an ordered list of nonzero values of said current sequence;

b. constructing a mask indicating positions at which said nonzero values occur in said current sequence; and c. constructing a result sequence of values comprising said ordered list. said mask and a count of the number of times steps (a) through (c) have been applied. thus obtaining a new current sequence of values to be used as input to a subsequent repetition of steps (a) through (c).

wherein said input sequence is a level-zero packed representation constructed in accordance with claim 2.

5. A method of compressing data for storage or transmission and recovering said compressed data, using a base sequence of values, said method comprising:

a. computing differences between said data and said base sequence of values;

b. constructing a compressed representation of said differences, said construction comprising the following steps:

1) computing a minimal set of deletion positions from said base sequence of values and insertions into the resulting sequence of values, such that the result of performing said deletions and insertions is said data;

2) constructing a deletion mask indicating said set of deletion positions in said base sequence;

3) constructing an insertion mask indicating the set of positions in said resulting sequence at which said insertions have occurred;

4) constructing an ordered list of the values to be inserted by said insertions; and 5) combining said insertion mask, said deletion mask and said ordered list to represent the difference between said base sequence and said data;

c. recovering said data from said base sequence and said representation of said differences by: constructing a sequence of values whose length is the length of said insertion mask, whose elements at positions at which insertions have occurred are the corresponding elements of said ordered list of values and whose elements at other positions are corresponding elements of said base sequence of values, excluding those elements of said base sequence at which said deletion mask indicates that a deletion has occurred.

6. A method of compressing a input sequence of values obtaining a compressed form for transmission or storage and decompressing said compressed form to recover said input sequence of values, said method comprising:

a. compressing said input sequence of values by setting a current sequence of values to said input sequence and repeating the following steps until a repetition of said steps no longer generates a shorter current sequence of values:

1) constructing an ordered list of nonzero values of said sequence;

2) constructing a mask indicating positions at which nonzero values occur in said sequence; and 3) constructing a result sequence of values comprising said ordered list, said mask and a count of the number of times steps (1) through (3) have been applied, thus obtaining a new sequence of values to be used as input to a subsequent repetition of steps (1) through (3), wherein the shortest current sequence of values obtained by a repetition of steps (1) through (3) represents a compression of said input sequence of values;

b. decompressing said compressed form for recovery by repeating the following steps the number of times indicated by said count:

1) extracting said mask and said ordered list of nonzero values from said form;

2) constructing a new sequence of values with one element for each bit of said mask with the values for elements described by said mask as having nonzero values coming from said ordered list of nonzero values and with the remaining elements of said new sequence set to zero; and 3) replacing said compressed form with said new sequence of values.

7. A method of compressing data for transmission or storage, using a given base sequence, and decompressing said compressed form to recover said data, said method comprising:

a. compressing said data by:

1) constructing a level-zero packed representation in accordance with claim 2;

2) compressing said level-zero packed representation to obtain a level-n compressed representation by: setting a current sequence of values to said input sequence and repeating the following steps until a repetition of said steps no longer generates a shorter current sequence of values, wherein the shortest current sequence of values obtained by a repetition of steps (i) through (iii) represents a compression of said input sequence of values:

i. constructing an ordered list of nonzero values of said current sequence:

ii. constructing a mask indicating positions at which said nonzero values occur in said current sequence; and iii. constructing a result sequence of values comprising said ordered list. said mask and a count of the number of times steps (i) through (iii) have been applied. thus obtaining a new current sequence of values to be used as input to a subsequent repetition of steps (i) through (iii);

b. decompressing said level-n compressed representation by:

1) extracting a count from said compressed representation;

2) repeating the following steps the number of times indicated by said count:

a) extracting a mask and an ordered list of nonzero values from said compressed representation;

b) constructing a new sequence of values with one element for each bit of said mask, with values for elements described by said mask as having nonzero values coming from said ordered list of nonzero values and with the remaining elements of said new sequence set to zero; and c) replacing said compressed representation with said new sequence of values;

3) extracting an insertion mask, a deletion mask and an ordered list of values from the resulting sequence; and 4) constructing a sequence of values whose length is the length of said insertion mask, whose elements at positions at which insertions have occurred are the corresponding elements of said ordered list of values, and whose elements at other positions are corresponding elements of said base sequence, excluding those elements of said base sequence at which said deletion mask indicates that a deletion has occurred.

8. A method for transmitting a changed version of an object from a sending node in a distributed system to a receiving node at which the original version of said object is known to exist, said method comprising:

a. performing the following steps at said sending node:
1) computing a main sequence of values representing said changed version of said object;
2) computing a base sequence of values representing said original version of said object;
3) computing a minimal set of deletion positions from said base sequence of values and insertions into the resulting sequence of values, such that the result of performing said deletions and insertions is said main sequence;
4) constructing a deletion mask indicating said set of deletion positions in said base sequence;
5) constructing an insertion mask indicating the set of positions in said main sequence at which insertions have occurred;
6) constructing an ordered list of the values inserted by said insertions;
7) combining said insertion mask, said deletion mask, and said ordered list into a level-zero packed representation in a manner that increases the likelihood that occurrences of the value zero occur contiguously in said level-zero packed representation; and
8) compressing said level-zero packed representation into a level-n packed representation by:
setting a current sequence of values to said input sequence and repeating the following steps until a repetition of said steps no longer generates a shorter current sequence of values. wherein the shortest current sequence of values obtained by a repetition of steps (i) through (iii) represents a compression of said input sequence of values:
  i. constructing an ordered list of nonzero values of said current sequence;
  ii. constructing a mask indicating positions at which said nonzero values occur in said current sequence: and
  iii. constructing a result sequence of values comprising said ordered list. said mask and a count of the number of times steps (i) through (iii) have been applied. thus obtaining a new current sequence of values to be used as input to a subsequent repetition of steps (i) through (iii);

b. transmitting said level-n packed representation and a key identifying said original version of said object to said receiving node;

c. performing the following steps at said receiving node;
1) receiving said level-n packed representation and key;
2) using said key to retrieve said base sequence of values, representing said original version of said object, or using said key to retrieve said original version of said object and computing said base sequence of values from said original version of said object as in step a(2);
3) decompressing said level-n packed representation into a level-0 packed representation by extracting a count from said level-n packed representation and repeating the following steps the number of times indicated by said count:
  a) extracting a mask and an ordered list of nonzero values from said level-n compressed representation;
  b) constructing a new sequence of values with one element for each bit of said mask, with values for elements described by said mask as having nonzero values coming from said ordered list of nonzero values and with the remaining elements of said new sequence set to zero; and
  c) replacing said level-n packed representation with said new sequence of values;
4) extracting said insertion mask, said deletion mask, and said ordered list from said level-0 packed representation;
5) constructing an edited sequence of values whose length is the length of said insertion mask, whose elements at positions at which insertions have occurred are the corresponding elements of said ordered list of values, and whose elements at other positions are corresponding elements of said base sequence of values, excluding those elements of said base sequence at which said deletion mask indicates that a deletion has occurred; and
6) interpreting said edited sequence as the representation of an object, constructing the object represented by said edited sequence, and using the object thus constructed as said changed version of said object.

* * * * *